(12) United States Patent
Hikita et al.

(10) Patent No.: US 7,241,703 B2
(45) Date of Patent: Jul. 10, 2007

(54) FILM FORMING METHOD FOR SEMICONDUCTOR DEVICE

(75) Inventors: Masahiro Hikita, Ashiya (JP); Yasuhiro Uemoto, Otsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 97 days.

(21) Appl. No.: 10/855,328

(22) Filed: May 28, 2004

(65) Prior Publication Data

US 2004/0242024 A1 Dec. 2, 2004

(30) Foreign Application Priority Data

May 30, 2003 (JP) .............................. 2003-155065

(51) Int. Cl.
*H01L 21/31* (2006.01)
(52) U.S. Cl. .................... 438/778; 438/763; 438/784; 438/787; 257/E21.628
(58) Field of Classification Search .................... None
See application file for complete search history.

(56) References Cited

U.S. PATENT DOCUMENTS

| 5,051,380 | A |   | 9/1991 | Maeda et al. |         |
|-----------|---|---|--------|--------------|---------|
| 5,332,694 | A | * | 7/1994 | Suzuki       | 438/624 |
| 5,965,203 | A |   | 10/1999| Gabric et al.|         |
| 6,124,216 | A | * | 9/2000 | Ko et al.    | 438/766 |
| 6,133,160 | A | * | 10/2000| Komiyama et al.| 438/761 |
| 6,489,254 | B1| * | 12/2002| Kelkar et al.| 438/778 |

FOREIGN PATENT DOCUMENTS

| JP | 3-123029 | 5/1991  |
|----|----------|---------|
| JP | 3-166372 | 7/1991  |
| JP | 3-198340 | 8/1991  |
| JP | 5-259155 | 10/1993 |
| JP | 8-008336 | 1/1996  |
| JP | 8-306685 | 11/1996 |

OTHER PUBLICATIONS

Wolf et al., "Silicon Processing for the VLSI Era", 1: Process Technology, Lattice Press, 1986, pp. 161-169, 182-183 and 187-191.*

(Continued)

*Primary Examiner*—Michael Lebentritt
*Assistant Examiner*—Cheung Lee
(74) *Attorney, Agent, or Firm*—Greenblum & Bernstein, P.L.C.

(57) ABSTRACT

A method of forming films in a semiconductor device that can appropriately control a resistance value of a thin film resistance on an ozone TEOS film while preventing a metal thin film from remaining around a surface step unit after the metal thin film was dry etched. First, as shown in FIG. 1A, a step unit with the height of about 1 μm is formed by forming elements such as HBT on a semiconductor substrate made up of semi-insulating GaAs. Next, as shown in FIG. 1B, a first ozone TEOS film with the thickness of 900 nm by a Normal pressure CVD method using mixed gas of tetraethoxysilane with ozone. Then, a second ozone TEOS film with the thickness of 100 nm is formed by reducing the ozone concentration to 10 $g/m^3$, while maintaining the substrate temperature at 350° C.

17 Claims, 6 Drawing Sheets

OTHER PUBLICATIONS

English Language Abstract of JP 3-123029.
English Language Abstract and Partial English Language of p. 13, Line 13 to p. 15, Line 1 of JP 3-166372.
English Language Abstract of JP 5-259155.
English Language Abstract of JP 3-198340.
English Language Abstract and Partial English Language of Paragraphs [0013]-[0034] of JP 8-008336.
English Language Abstract of JP 8-306685.

\* cited by examiner

Related Art

FILM FORMING METHOD FOR SEMICONDUCTOR DEVICE

BACKGROUND OF THE INVENTION (1) Field of the Invention

The present invention relates to a film forming method for a semiconductor device, and in particular to a method of forming interlayer dielectric films on a semiconductor device which has step units.

(2) Description of the Related Art

A monolithic microwave integrated circuit (MMIC) which is a semiconductor integrated circuit designed for high frequency is formed by integrating active elements such as a field effect transistor (FET) and a hetero-junction bipolar transistor (HBT) into passive elements such as a resistance, an inductor and a capacitor on a single semiconductor substrate. Comparing to a single element, the MMIC can realize a reduction of a price because it can miniaturize and lighten microwave components. Furthermore, there is no need to connect between elements with a golden wire in the MMIC so that the high frequency characteristic is improved.

A thin film resistance by metal such as tungsten silicon nitride (WSiN) is used for the resistance that is one of the components of the MMIC. The thin film resistance is formed by forming metal into a film using a sputtering method and patterning the formed metal by dry etching using chlorine gas. At this time, the thin film resistance is formed on a dielectric film such as a silicon oxide film (SiO2) to separate the thin film resistance electrically from other elements. However, in the case where elements such as FET and HBT are previously formed, the metal remains around a step unit of the element and cannot be removed by dry etching.

FIG. 6 is a cross-section diagram of a semiconductor device for explaining a problem of metal remaining in the case where this conventional thin film resistance is formed.

A metal remaining 604 which cannot be removed by dry etching occurs around a step unit 605 on a substrate 601 by depositing a metal thin film on a dielectric film 603 and forming a thin film resistance 602 by the dry etching when there are surface steps such as a step unit 605 on the substrate 601.

To avoid the problem, for example, there is a dielectric film forming method using SiO2 film (hereafter referred to as ozone TEOS (Tetraethylorthosilicate) film) that is formed by a normal pressure CVD method using mixed gas of organosilane with ozone (refer to Japanese Laid-Open Patent Publication application No. 3-123029). Compared to a SiO2 film formed by a conventional plasma CVD method, the ozone TEOS film has good step coverage, and a surface step can be moderated. Therefore, the problem of metal remaining around the step unit can be avoided by using an ozone TEOS film as a base dielectric film of the thin film resistance.

However, the conventional dielectric film formation method has a following problem. The ozone TEOS film changes its step coverage according to ozone concentration and the step coverage is improved as the ozone concentration is higher. However, if the ozone TEOS film is formed using ozone with high concentration to moderate the step, the surface of the ozone TEOS film becomes rougher. As the result, the resistance value of the thin film resistance on the ozone TEOS film changes so that a designed resistance value cannot be obtained.

SUMMARY OF THE INVENTION

Considering the above mentioned problems, the present invention provides a film forming method for a semiconductor apparatus which has high credibility at the time of manufacturing and also has a great controllability.

To solve the above mentioned problems, a film forming method for a semiconductor device according to the present invention comprises a first film forming step of forming a first silicon oxide film on a semiconductor substrate by chemical vapor deposition method using reactive gas including ozone; and a second film forming step of forming a second silicon oxide film on the first silicon oxide film by the chemical vapor deposition method with an ozone concentration lower than in the case of said first film forming step.

Also, the film forming method of the semiconductor device according to the present invention is the film forming method for the semiconductor device wherein the thickness of the second silicon oxide film is 50 nm or more.

Thus, the present invention can prevent the roughness on the surface of the silicon oxide film moderately and control the resistance value of the thin film resistance by making the thickness of the second silicon oxide film using low concentration.

As above explained, the film forming method of the semiconductor device according to the present invention has good step coverage and can control the roughness of the surface of the ozone TEOS film. Therefore, the credibility of the semiconductor device becomes higher, preventing moisture to enter.

As further information about technical background to this application, the disclosure of Japanese Patent Application No. 2003-155065 filed on May 30, 2003 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the drawings.

DESCRIPTION OF THE PREFERRED EMBODIMENT(S)

The film forming method for the semiconductor device according to the embodiment of the present invention is explained with reference to figures. Note that, numeric values used in the following explanation are examples.

Figure 1A:
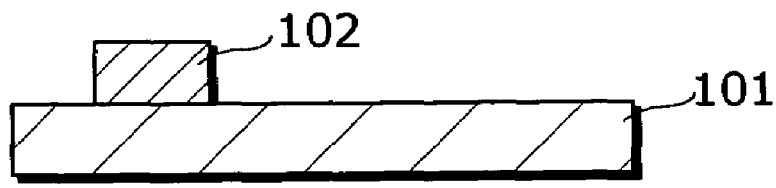
FIGS. 1A, 1B, 1C, and 1D are process cross-section diagrams of a semiconductor device according to the embodiment of the present invention.

FIGS. 1A, 1B, 1C and 1D are process cross-section diagrams of the semiconductor device according to the embodiment of the present invention. First, as shown in FIG. 1A, a step unit 102 with about 1 μm height is formed by forming elements such as HBT on a semiconductor substrate 101 which made up with semi-insulating GaAs. Note that, the step unit 102 is an electrode and the like.

Figure 1B:
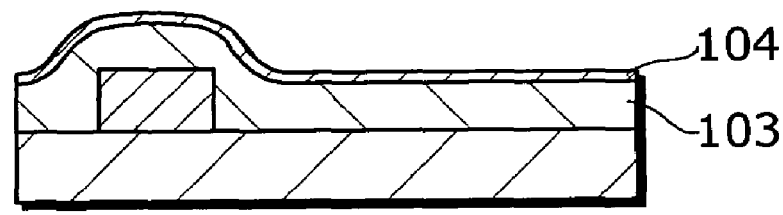

Next, as shown in FIG. 1B, the first ozone TEOS film 103 with the thickness of 900 nm is formed by the normal pressure CVD method that uses mixed gas of tetraethoxysilane with ozone. The temperature of the substrate at this time is 350° C. and the ozone concentration is 140 g/m$^3$. Then, the second ozone TEOS film 104 with the thickness of 100 nm is formed by reducing the ozone concentration to 10 g/m$^3$ while maintaining the substrate temperature at 350° C.

Figure 1C:
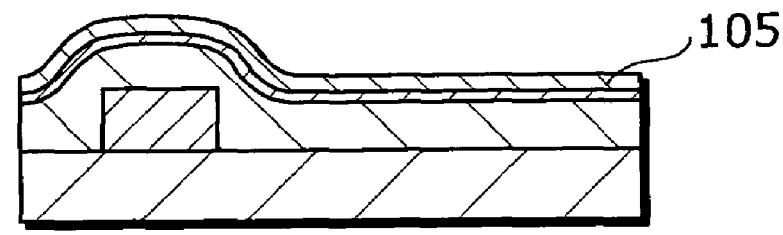
Figure 1D:
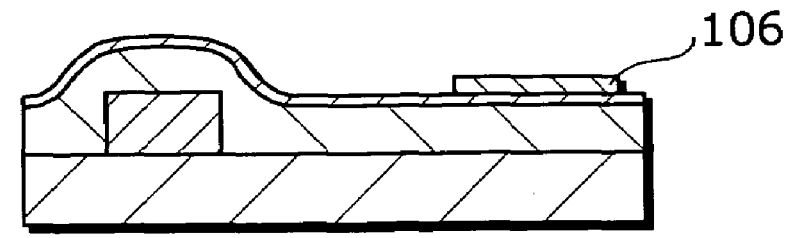

After that, as shown in FIG. 1C, a metal film 105 is deposited in 100 nm thick all over, the metal film 105 being made up with WSiN by a reactive sputtering method in the nitrogen atmosphere. Next, a patterning is performed by photo resist on an area where thin film resistance is formed by photo lithography, and the metal film except that on the resistance is removed by a dry etching that uses chlorine gas and oxide gas. Subsequently, by ashing the photo resist, a thin film resistance 106 is formed as shown in FIG. 1D. The thickness of the thin film resistance 106 becomes 100~200 nm.

While depositing the first ozone TEOS film which uses ozone with high concentration as thick as possible is needed for the better step coverage, the film thickness is limited in terms of processing when the ozone TEOS film needs to be dry etched in a later process. However, it is desirable to make the first ozone TEOS film to have a film thickness with 50% or more of the height of a step unit to prevent the metal from remaining around the step unit when the thin film resistance is dry etched. Additionally, the step covering is easily affected by ozone concentration so that the covering is more improved as the concentration is higher. Therefore, it is desirable to have 100 g/m$^3$ or more of the ozone concentration.

After the first ozone TEOS film is deposited, it is desirable to set the ozone concentration at 50 g/m$^3$ or less to moderate roughness of the surface of the ozone TEOS film in the case where the second ozone TEOS film that uses low concentration ozone is continuously deposited. While the roughness on the surface is moderated as the second ozone TEOS film is thicker, the thickeness is limited in terms of processing.

Figure 2:
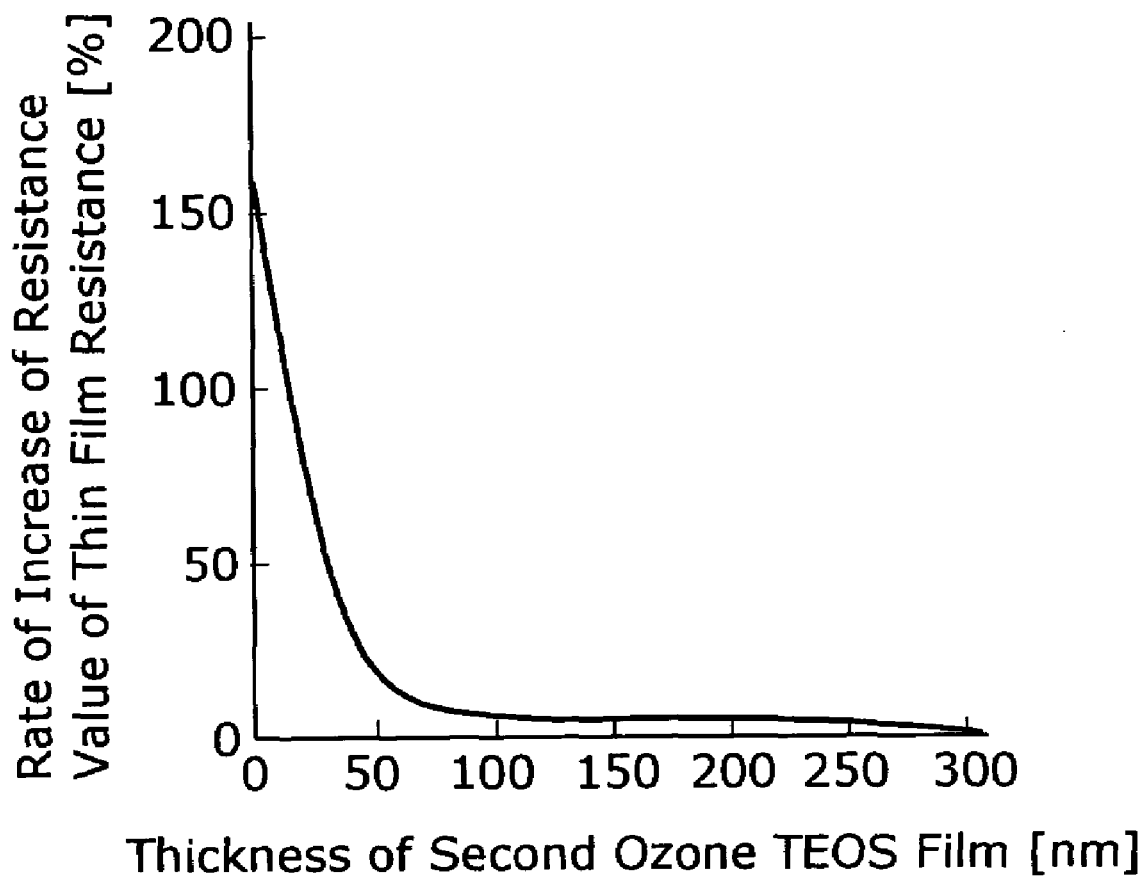
FIG. 2 is a diagram showing a dependency of resistance value to the thickness of the second ozone TEOS film according to the embodiment of the present invention.

FIG. 2 is a graph showing a dependency of resistance value of thin film resistance to the thickness of the second ozone TEOS film according to the embodiment of the present invention. The figure shows that the increase of resistance value of the thin film resistance can be controlled when the thickness of the second ozone TEOS film is 50 nm or more. In here, FIG. 2 compares resistance values of thin film resistance formed on the second ozone TEOS film using the normal pressure CVD method with the resistance value of the thin film resistance formed using the plasma CVD method as 100%.

Figure 3:
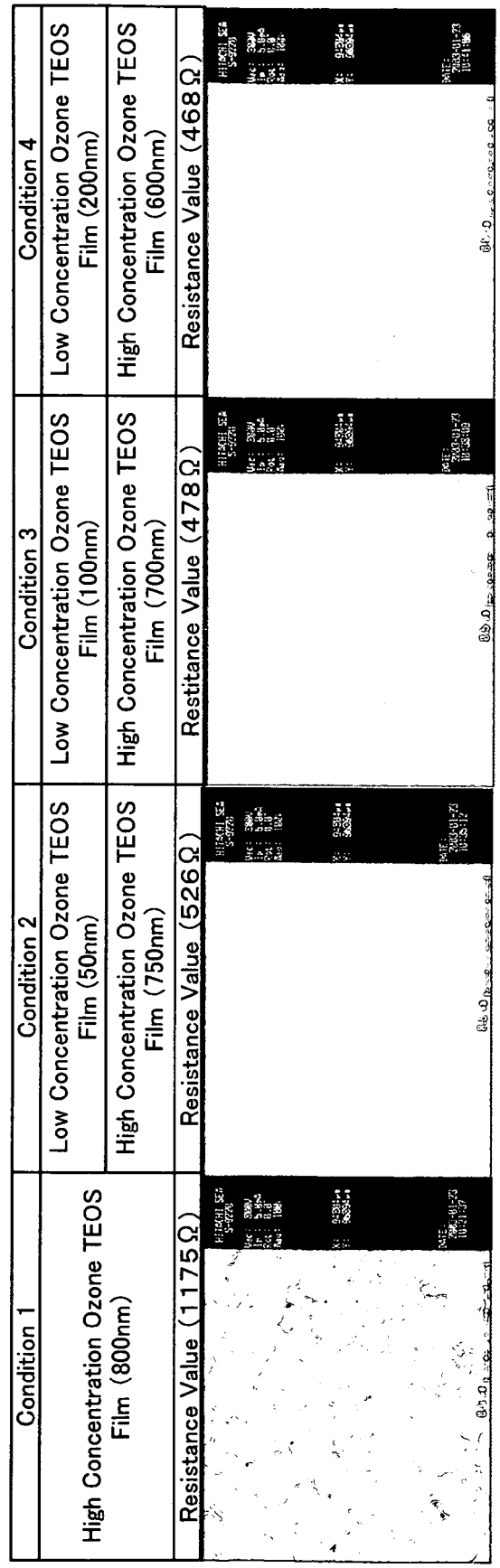
FIG. 3 is an enlarged photo diagram showing surface conditions in the case where film thicknesses of a first ozone TEOS film and the second ozone TEOS film are changed.

FIG. 3 is an enlarged photo diagram showing surface conditions in the case where film thicknesses of the first ozone TEOS film and the second ozone TEOS film are changed. Here, a scanning electron microscope (SEM) is used and the figure shows measured diagrams enlarged one hundred thousandfold.

In FIG. 3, the condition 1 shows the surface condition in the case where only high concentration ozone TEOS films are deposited in 800 nm thick; the condition 2 shows the surface condition in the case where the second low concentration ozone TEOS film is continuously deposited in 50 nm thick after the high concentration ozone TEOS film is deposited in 750 nm thick; the condition 3 shows the surface condition in the case where the second low concentration ozone TEOS film is continuously deposited in 100 nm thick after the high concentration ozone TEOS film is deposited in 700 nm thick; and the condition 4 shows the surface condition in the case where the second low concentration ozone TEOS film is continuously deposited in 200 nm thick after the high concentration ozone TEOS film is deposited in 600 nm thick.

In the later processes, the metal film made up with WSiN by a reactive sputtering method in the nitrogen atmosphere is deposited in 100 nm thick and a thin film resistance is formed. While the resistance value of the thin film resistance is 1000 Ωor more under the condition 1, it becomes around 500 Ω as it is set under the conditions 2 and 3.

Thus, as thicker the second ozone TEOS film, the roughness of the surface is reduced. However, it is desirable to set the thickness of the second TEOS film around 50 nm~100 nm as shown in the conditions 2 and 3 in order to control the film thickness resistance.

Figure 4A:
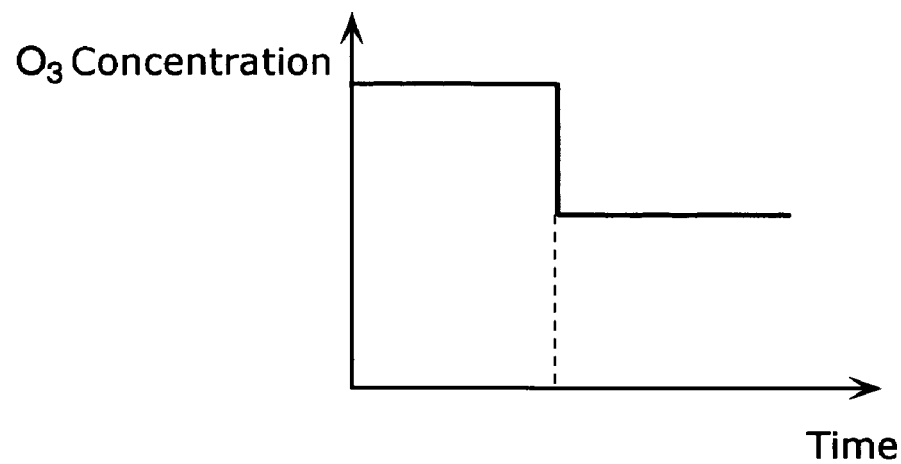
FIGS. 4A, 4B, and 4C, are graphs showing a relationship of time and ozone concentration in the process of forming films by the film forming method for the semiconductor device.
Figure 4B:
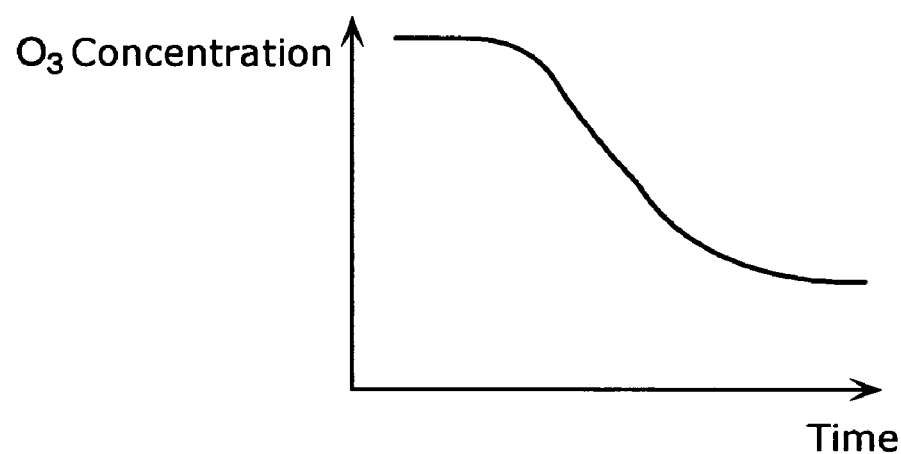
Figure 4C:
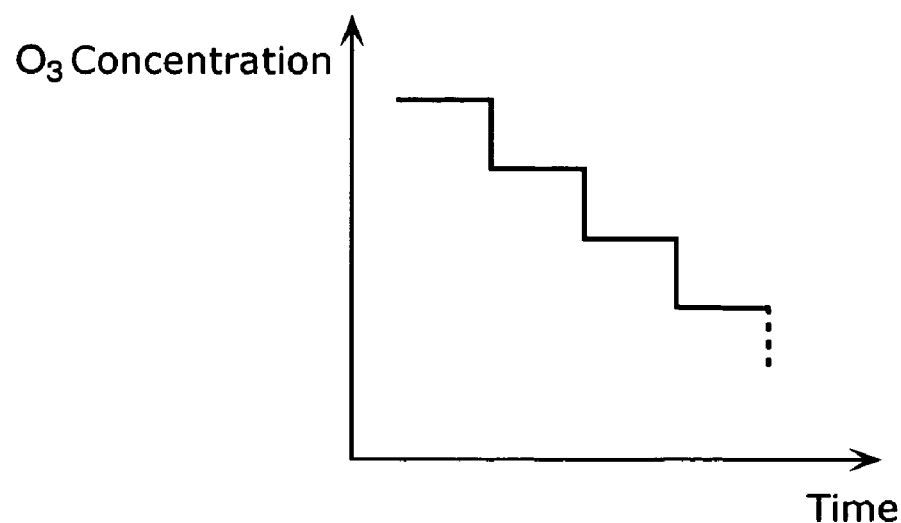

Here, in the process of forming an ozone TEOS film on a semiconductor substrate by the Normal pressure CVD method, a method as shown in FIGS. 4A, 4B and 4C can be recognized other than the methods of forming the ozone TEOS film using the first and the second ozone concentration.

FIG. 4 is a graph showing a relationship of time with ozone concentration in the process of forming films in the semiconductor device.

FIG. 4A is a graph in the case where the first ozone TEOS film and the second ozone TEOS film are used for forming the ozone TEOS film. FIG. 4B is a graph in the case where the ozone TEOS film is formed by continuously changing the ozone concentration as time passes in order to change the ozone concentration according to a growth of the ozone TEOS film. FIG. 4C is a graph in the case where the ozone TEOS film is formed by changing the ozone concentration in a step-like manner in relation with time.

Thus, in the method of forming films in the semiconductor device according to the present invention, other than the method of forming the ozone TEOS film using the first and second ozone concentration by the normal pressure CVD method, a method of forming the ozone film by continuously changing the ozone concentration, a method of forming the ozone TEOS film by dividing the ozone concentration in two or more steps, and the like are suggested.

FIGS. 5A, 5B, 5C and 5D are process cross-section diagrams for comparing the normal pressure CVD method and the plasma CVD method in the process of forming films.

Figure 5A:
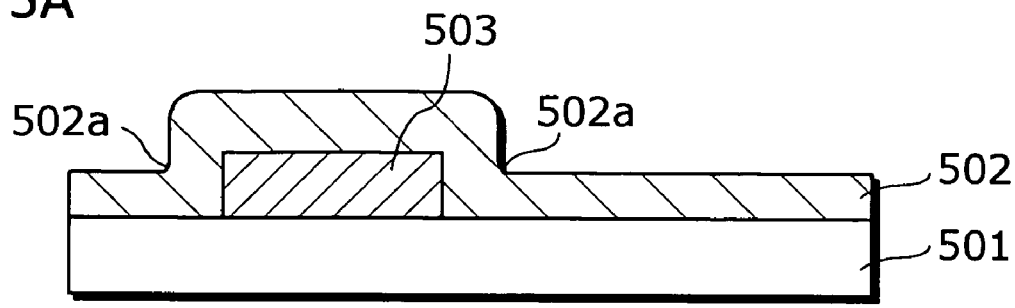
FIGS. 5A, 5B, 5C, and 5D are process cross-section diagrams for comparing a normal pressure CVD method to a plasma CVD method in the process of forming films.
Figure 5B:
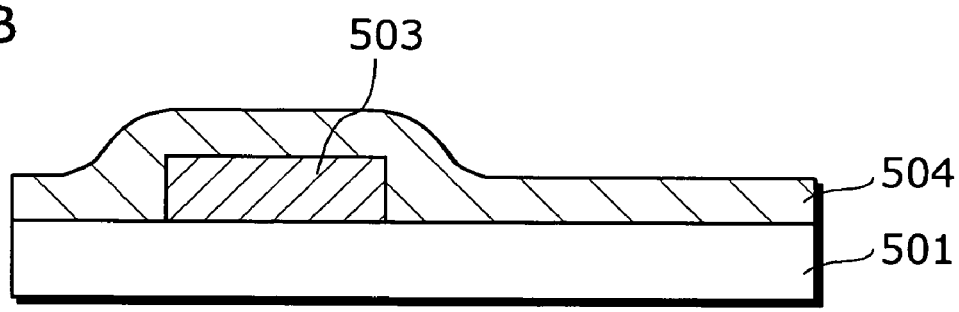

FIG. 5A shows the case of where either a SiO2 film 502 is formed by the plasma CVD method or an ozone TEOS film 502 is formed using low concentration ozone by the normal pressure CVD method. In this case, hollows 502a are generated around the step unit covered by either the SiO2 film 502 or the ozone TEOS film 502. FIG. 5B shows a diagram of forming an ozone TEOS film 504 using high concentration ozone by the normal pressure CVD method on the step unit 503 such as electrode installed on the substrate 501. Here, the generation of the hollows 502a shown in FIG. 5A are prevented by using the high concentration ozone which improves the step coverage.

Figure 5C:
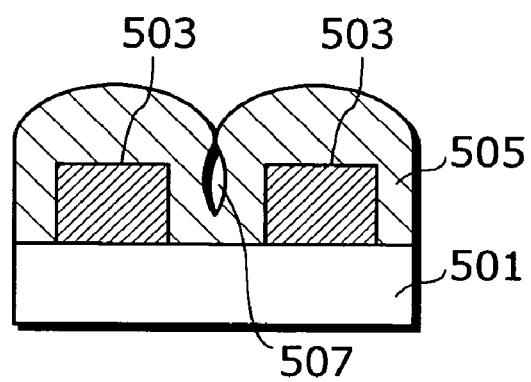
Figure 5D:
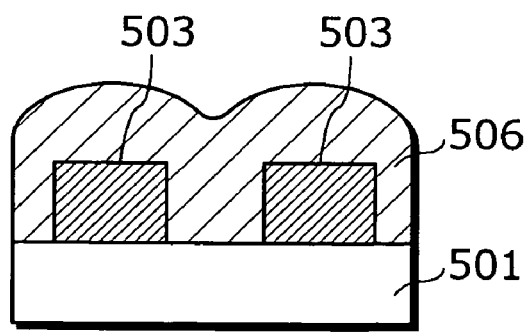
Figure 6:
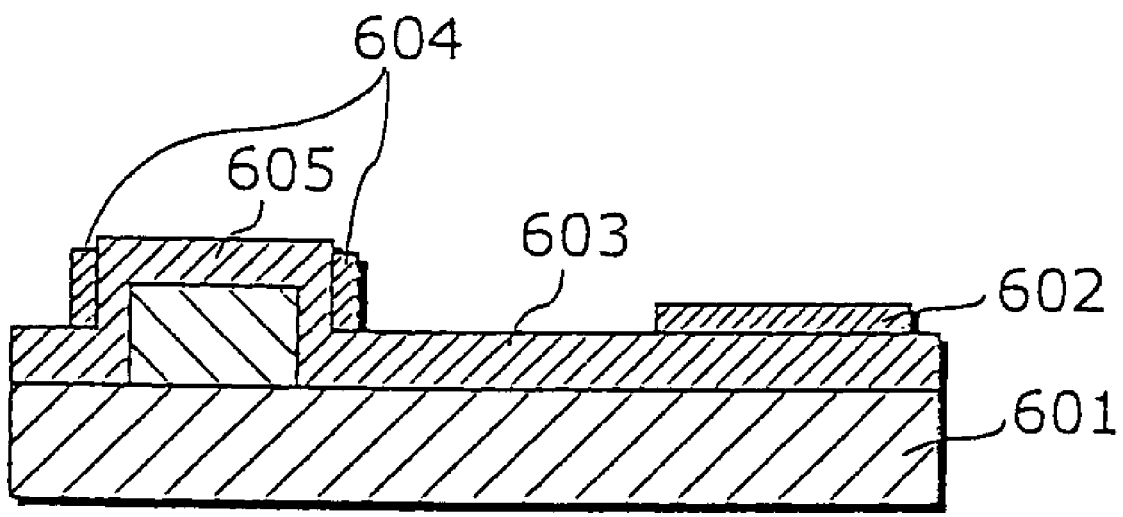
FIG. 6 is a process cross-section diagram of a semiconductor device for explaining a problem of metal remaining by a conventional method of forming thin film resistance.

Furthermore, FIG. 5C shows a diagram, in the case where a SiO2 film 505 is formed by the plasma CVD method, in which a void 507 is formed between electrodes such as step unit 503 because the upper part of the SiO2 film 505 precedently sticks. FIG. 5D shows an ozone TEOS film 506 formed when the normal pressure CVD method with high ozone concentration is used. Thus, the creation of the void 507 is prevented by forming the ozone TEOS film 506 by the use of the normal pressure CVD method using high ozone concentration.

As above described, according to the method of forming films in the semiconductor devices forming the ozone TEOS film in the first and the second ozone concentration improves step coverage and the surface roughness of the ozone TEOS film is controlled. Therefore, water penetration from outside becomes difficult so as to increase the credibility of the semiconductor device.

Furthermore, the resistant value of the thin film resistance formed on the ozone TEOS film can be controlled to the vale as it is set since the surface roughness of the ozone TEOS film is prevented. Accordingly, it becomes possible to manufacture a stable semiconductor with high reproducibility.

Furthermore, since the first and the second ozone TEOS films are continuously deposited, only the ozone concentration in the process of forming films using the normal pressure CVD method is changed so as to increase the productivity of the semiconductor device.

Although only an exemplary embodiment of this invention has been described in detail above, those skilled in the art will readily appreciate that many modifications are possible in the exemplary embodiment without materially departing from the novel teachings and advantages of this invention. Accordingly, all such modifications are intended to be included within the scope of this invention.

INDUSTRIAL APPLICABILITY

The method of forming films in the semiconductor device according to the present invention can be used as a method of forming interlayer dielectric films in the semiconductor device which has step units.

What is claimed is:

1. A method of forming a film for a semiconductor device, comprising:
    forming a first silicon oxide film on a semiconductor substrate by chemical vapor deposition using a reactive gas including ozone; and
    forming a second silicon oxide film on the first silicon oxide film by chemical vapor deposition with an ozone concentration lower than that used in the forming of the first silicon oxide film,
    wherein the thickness of the second silicon oxide film is 50 nm to 100 nm.
2. The method of forming a film for the semiconductor device according to claim 1,
    wherein the ozone concentration in the forming of the first silicon oxide film is 100 $gm^3$ or more and the ozone concentration in the forming of the second silicon oxide film is 50 $gm^3$ or less.
3. The method of forming a film for the semiconductor device according to claim 2,
    wherein the ozone concentration in the forming of the first silicon oxide film is about 140 $g/m^3$ and the ozone concentration in the forming of the second silicon oxide film is about 10 $gm^3$.
4. The method of forming a film for the semiconductor device according to claim 1,
    wherein a thickness of the second silicon oxide film is 50 nm or more.
5. The method of forming a film for the semiconductor device according to claim 4,
    wherein the thickness of the first silicon oxide film is 700 nm to 900 nm.
6. The method of forming a film for the semiconductor device according to claim 1,
    wherein the semiconductor substrate has a step and a thickness of the first silicon oxide film is 50% or more of a height of said step.
7. The method of forming a film for the semiconductor device according to claim 6,
    wherein the height of said step is 500 nm or more.
8. The method of forming a film for the semiconductor device according to claim 1,
    wherein the reactive gas includes organosilane materials.
9. The method of forming a film for the semiconductor device according to claim 8,
    wherein the organosilane materials comprise tetraethoxysilane.
10. The method of forming a film for the semiconductor device according to claim 1, further comprising:
    forming a metal film on the second silicon oxide film after the forming of the second silicon oxide film; and
    removing a part of said metal film by dry etching.
11. The method of forming a film for the semiconductor device according to claim 1,
    wherein the chemical vapor deposition is performed under an atmospheric pressure.
12. The method of forming a film for the semiconductor device according to claim 1,
    wherein the semiconductor substrate has at least one step, and
    the first silicon oxide film and the second silicon oxide film are formed on the step.
13. The method of forming a film for the semiconductor device according to claim 12,
    wherein the semiconductor substrate has two steps, and the first silicon oxide film and the second silicon oxide film are formed between the two steps.
14. A method of forming a film for a semiconductor device for forming a silicon oxide film on a semiconductor substrate by chemical vapor deposition using a reactive gas including ozone,
    wherein an ozone concentration is reduced according to a formation of said silicon oxide film.
15. The method of forming a film for the semiconductor device according to claim 14,
    wherein the ozone concentration is continuously changed over time.
16. The method of forming a film for the semiconductor device according to claim 14,
    wherein the ozone concentration is changed in a step-like manner over time.
17. A method of forming a film for a semiconductor device, comprising:
    forming a first silicon oxide film on a semiconductor substrate by chemical vapor deposition using a reactive gas including ozone;

forming a second silicon oxide film on the first silicon oxide film by chemical vapor deposition with an ozone concentration lower than that used in the forming of the first silicon oxide film;

forming a metal film on the second silicon oxide film after the forming of the second silicon oxide film; and removing a part of said metal film by dry etching;

wherein said forming of the metal film on the second silicon oxide film is performed next to said forming of the second silicon oxide film.

* * * * *